(12) United States Patent
Laity et al.

(10) Patent No.: US 9,934,086 B2
(45) Date of Patent: Apr. 3, 2018

(54) APPARATUSES AND METHODS FOR SELECTIVE DETERMINATION OF DATA ERROR REPAIR

(71) Applicant: Micron Technology, Inc., Boise, ID (US)

(72) Inventors: Ryan S. Laity, Boise, ID (US); Christopher S. Johnson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/174,462

(22) Filed: Jun. 6, 2016

(65) Prior Publication Data

US 2017/0351570 A1    Dec. 7, 2017

(51) Int. Cl.
*G06F 11/10* (2006.01)
*G11C 29/52* (2006.01)

(52) U.S. Cl.
CPC .......... *G06F 11/1068* (2013.01); *G11C 29/52* (2013.01)

(58) Field of Classification Search
CPC ........................................ G06F 11/10
USPC .................. 714/764, 773, 780, 748, 800
See application file for complete search history.

(56) References Cited

U.S. PATENT DOCUMENTS

| | | | |
|---|---|---|---|
| 6,701,451 B1 | 3/2004 | Cohen et al. | |
| 8,127,205 B2 | 2/2012 | Hirano et al. | |
| 2005/0204091 A1* | 9/2005 | Kilbuck | G06F 12/0802 711/103 |
| 2007/0061672 A1* | 3/2007 | Eggleston | G06F 11/1008 714/758 |
| 2015/0186260 A1* | 7/2015 | Camp | G06F 12/0246 711/103 |
| 2015/0363262 A1* | 12/2015 | Hu | G06F 11/1048 714/773 |
| 2016/0092290 A1 | 3/2016 | Gerstyl et al. | |
| 2017/0160960 A1* | 6/2017 | Camp | G06F 3/0619 |

* cited by examiner

*Primary Examiner* — Fritz Alphonse
(74) *Attorney, Agent, or Firm* — Brooks, Cameron & Huebsch, PLLC

(57) ABSTRACT

Apparatuses and methods are described for selective determination of data error repair. An example apparatus includes a memory array and a controller coupled to the memory array. The controller is configured to direct performance, responsive to a request, of a read operation at an address in the memory array, direct detection of an error in data corresponding to the read operation address, and direct storage of the read operation address in an address error register. The controller is further configured to direct a response be sent to the enable selective determination of data error repair, where the response does not include the read operation address.

26 Claims, 4 Drawing Sheets

APPARATUSES AND METHODS FOR SELECTIVE DETERMINATION OF DATA ERROR REPAIR

TECHNICAL FIELD

The present disclosure relates generally to semiconductor memory apparatuses and methods, and more particularly, to apparatuses and methods for selective determination of data error repair.

BACKGROUND

Memory devices are typically provided as internal, semi-conductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory. Memory cells can be arranged into arrays, with the arrays being used in memory devices.

When data is sent (e.g., communicated, passed, transferred, transmitted, etc.) from one location to another, there is a possibility that an error may occur. Errors can also occur over time while data is stored in a memory. Such errors may interfere with reading of data as it was intended to be stored in the memory. There are a number of techniques that can be used to encode data so that an error can be detected and/or corrected. Since data is routinely sent to and from memory, and stored therein, memory can employ error correction techniques to attempt to correct data errors associated with the memory.

DETAILED DESCRIPTION

Figure 1:
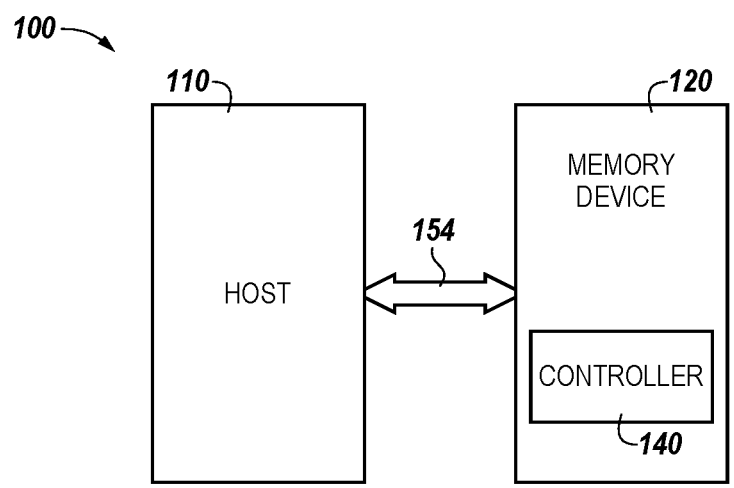
FIG. 1 is a block diagram of an apparatus in the form of a computing system including a host and a memory device in accordance with a number of embodiments of the present disclosure.

Apparatuses and methods are described for selective determination of whether data errors in memory are to be repair. An example apparatus includes a memory array and a controller coupled to the memory array. The controller is configured to direct performance, responsive to a request, of a read operation at an address in the memory array, direct detection of an error in data corresponding to the read operation address, and direct storage of the read operation address in an address error register. The controller is further configured to direct a response be sent to enable the selective determination of data error repair, where the response does not include the read operation address.

Upon detection of an error in data corresponding to a read operation address to be utilized in performance of a read operation requested by a host, a memory device separate from the host, as described herein, that is instructed to perform the operation may store (e.g., log, write, etc.) a read operation address of the data error in an address error register in the memory device. The read operation address may correspond to a location in the memory device (e.g., combinations of designations for a bank, a column, and/or a row, among other possible designations for memory locations) in which one or more erroneous data units are stored in memory cells.

The read operation addresses of the one or more data errors are not to be included in an error report (e.g., in a response packet, as described herein) to the host because, for example, the size of the report may be insufficient to include enough bits to record the read operation address in addition to other information included therein (e.g., read data, a notification of the data error, and/or the type of data error, etc.). In addition, a particular protocol corresponding to the memory device (e.g., a hybrid memory cube (HMC)) and/or an interface between a memory device and a host may dictate that the read response packet does not include the read operation address. For instance, the read operation address may not be included because the memory device may be configured for "automated" repair of data errors and not for "manual" decisions (e.g., determinations) by the host about which data errors and/or types of data errors to repair, among other reasons presented herein.

Particular read operation addresses corresponding to the detected data errors in the memory device may be retrieved to the host. The read operation addresses may be presented (e.g., using a host processor) in a format readable by host error analysis and/or repair protocols and/or in a format readable by a user (e.g., a technician, operation manager, etc.). Presentation of read operation addresses in association with identification of the operation requested and/or a type of data error may enable the host and/or a sideband processor (e.g., based on a decision by the host protocols and/or the user) to make a selection of which data errors are or are not to be repaired. For example, the repair options may include presenting the detected data error as a type of data error selected from a single-bit correctable error (SCE), a multi-bit correctable error (MCE), and/or a multi-bit uncorrectable error (MUE), among other possible types of error.

A repair option for such data errors may enable a bypass of an automated error repair operation that may otherwise have been performed to correct the data error. For example, an option may be selected whereby initiation of an error repair operation is delayed. In some embodiments, the error repair operation may be delayed until a time at which performance of other data processing operations (e.g., reads, writes, logical operations, such as Boolean operations, etc.) by the memory device is determined to be reduced relative to a time of the data error (e.g., in the response packet) and/or read operation address (e.g., following retrieval of the read operation address) being originally presented to the host.

In various instances, a quantity of data (e.g., bits) that may be correctable via an error correction technique is exceeded, resulting in an uncorrectable data error. It may be beneficial to determine memory addresses that experience uncorrectable errors and take corrective actions, such as by refraining from storing data at those addresses.

In some previous implementations, a controller and/or processor associated with a host may not be configured to retrieve addresses for various types of errors in data to be utilized in performance of requested operations. As such, for example, the host may not be enabled to recognize and/or specifically account for one or more problematic memory cells in the memory device (e.g., at a read operation address in a row and/or column). However, when the host is provided this information, as described herein, a more robust system design may be implemented in which, for example, downtime of the system may be reduced when a data unit data error has been detected, for example, by the selective determination of whether and/or when the data error is to be repaired.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory devices) can refer to one or more memory devices, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically or for access to and movement (transmission) of commands and/or data, as appropriate to the context. The terms "data" and "data units" are used interchangeably herein and can have the same meaning, as appropriate to the context.

The figures herein follow a numbering convention in which the first digit or digits correspond to the drawing figure number and the remaining digits identify an element or component in the drawing. Similar elements or components between different figures may be identified by the use of similar digits. For example, 120 may reference element "20" in FIG. 1, and a similar element may be referenced as 420 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a host 110 and a memory device 120 in accordance with a number of embodiments of the present disclosure. As used herein, a host 110, a memory device 120, a controller 140, a hybrid memory cube (HMC) 220, a memory array 230, an address error register 291, and/or error-correcting code (e.g., ECC) 293, as illustrated in the respective figures herein, each might also be separately considered an "apparatus."

The computing system 100 can include the host 110 being coupled to memory device 120 via a number of buses 154. The buses can, in various embodiments, include address, control, and/or input/output (I/O) buses, among other possible types of bus. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The computing system 100 can include separate integrated circuits for both the host 110 and the memory device 120 and/or the host 110 and the memory device 120 may be on the same integrated circuit. The computing system 100 can include digital signal processors (DSPs) and/or mobile processors.

The host 110 can create commands for execution of operations by the memory device 120, for example, data read, data write, data erase, logical operations, such as Boolean operations, etc. The commands created by the host 110 can be associated with addresses in the memory device for performance of the commands. For example, as described herein, a command and an associated address, among other associated information, may be included in a request packet, as shown at 351 and described in connection with FIG. 3A. The command and the associated address can be sent to the memory device via bus 154. Confirmation of successful completion of the requested operation or notification that the requested operation was not successfully completed due to, for example, detection of a data error in data to be utilized in performance of the operation may be included in a response packet, as shown at 353 and described in connection with FIG. 3B.

Memory device 120 can be a DRAM device, an HMC device, SRAM device, STT RAM device, PCRAM device, TRAM device, processing-in-memory (PIM) device, RRAM device, NAND flash device, and/or NOR flash device, for instance. In a number of embodiments, memory device 120 can include a controller 140 that, in various embodiments, may correspond to controller 240 and/or vault controls 288, as shown and described in connection with FIG. 2, and/or a controller, as shown at 440 and described in connection with FIG. 4. A number of controllers 140 may be located in memory device 120 and/or in association with memory arrays of memory device 120. As such, the controllers shown at 140, and at corresponding indicator numbers, are not located elsewhere. For example, these controllers are not in and/or in association with the host 110 (e.g., controllers 140 are not the same as channel controllers 443 shown in and described in connection with host 410 in FIG.

4). In a number of embodiments, the computing system 100 can include a number of memory devices, where the number of memory devices can be a variety of different types of memory devices that each may include a controller to direct performance of the operations described herein.

Figure 2:
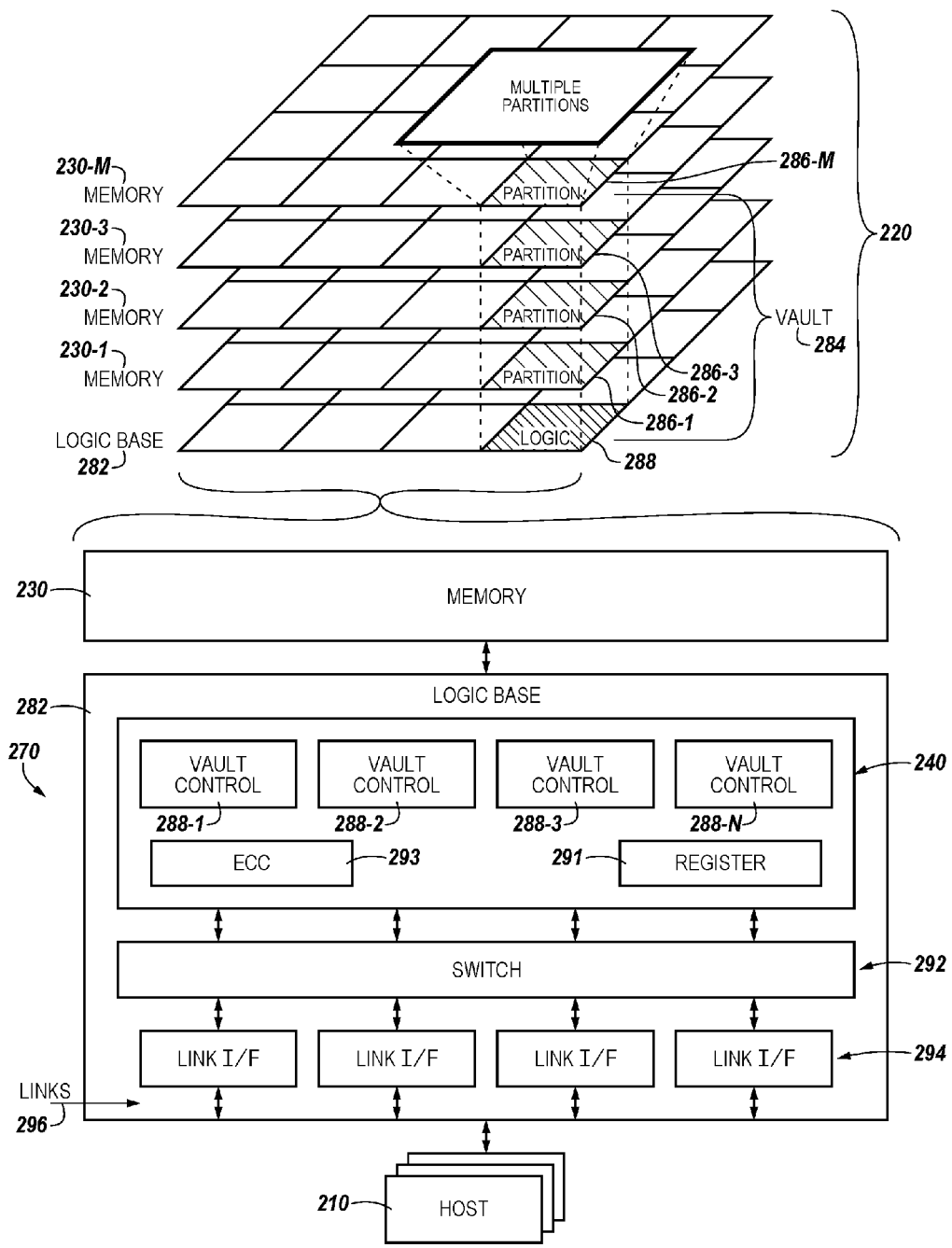
FIG. 2 is another block diagram of an apparatus in the form of a computing system including a host and a memory device in accordance with a number of embodiments of the present disclosure.

FIG. 2 is another block diagram of an apparatus in the form of a computing system 270 including a host 210 and a memory device 220 in accordance with a number of embodiments of the present disclosure. In some embodiments, the computing system 270 may include an HMC device 220 as the memory device and the host 210. The host 210 may include a number of processors. The processors may be analogous to the processors described in association with host 110 illustrated in FIG. 1. The computing system 270 may be analogous to the computing device 100 illustrated in FIG. 1. In FIG. 2, more detail is shown regarding a specific example of a memory device (e.g., HMC 220), although embodiments of the present disclosure are not limited to an HMC. In various embodiments, a memory mapping module, including filter(s) and plurality of mapping mechanisms, may be implemented in various manners between the host 210 and the HMC 220, such as in control circuitry described below.

The HMC 220 may be a single package including multiple memory arrays 230-1, 230-2, 230-3 . . . , 230-M (e.g., DRAM dies) and a hardware logic base 282 (e.g., a logic die, an application-specific integrated circuit (ASIC), corresponding logic in another device, etc.) stacked together. The memory arrays 230 and logic base 282 may be stacked using through silicon vias (TSV), although other embodiments may differ (e.g., the logic base 282 may not necessarily be stacked with the memory arrays 230).

The memory 230 within the HMC 220 can be organized into subsets (e.g., vaults 284), where each vault 284 may be functionally and/or operationally independent of other vaults 284. Each vault 284 may include a partition 286-1, 286-2, 286-3 . . . , 286-M that is a subset of memory from each of the memory arrays 230 such that each vault can include multiple stacked partitions. Each vault 284 can include a vault control 288 (e.g., a number of hardware logic units as shown at 288-1, 288-2, 288-3, . . . , 288-N in FIG. 2) in the logic base 282. The vault controls 288 may function analogously to and/or form part of a controller (e.g., as shown at 140 and described in connection with FIG. 1 and/or at corresponding indicator numbers in FIGS. 2 and 4) for the vault 284. Each vault control 288 can be coupled to a respective subset of the plurality of memory arrays 230 (e.g., all or some of the stacked partitions 286-1, 286-2, 286-3, . . . , 286-M shown in FIG. 2). For example, the vault control 288 can manage memory operations for the vault 284, including determining its own timing requirements (e.g., instead of being managed by a processor or a requesting device).

The vault control 288 can include a number of buffers for requests from and/or reports to the host 210 (e.g., a host processor) and can utilize the number of buffers to send reports to the host 210 out of order with respect to an order in which the requests were received from the host 210. Thus, the host 210 can be configured to send a request via an interface (e.g., via input/output (I/O) links 296 and/or link interfaces (I/Fs) 294) to the HMC 220 without being aware of a read time associated with the request.

The lower portion of FIG. 2 includes a more detailed illustration of a logic base 282 coupled between the memory 230 and the host 210. The logic base 282 can include memory control logic (e.g., as shown at 470 and described in connection with FIG. 4) for each vault (e.g., in respective vault controls 288). The vault control 288 can be coupled to shared memory control logic for the HMC 220 that can consolidate functions of the vaults 284. However, the shared memory control logic does not necessarily include a central memory controller in the traditional sense because each of the vaults 284 may be directly controlled (e.g., control of timing, access, etc.) independently of each other and because the shared memory control logic may not necessarily interface (e.g., directly interface) with the host 210 and/or a processor thereof. Thus, in some embodiments, the computing system 270 and/or the HMC memory device 220 may not include a central memory controller.

The controller 340 for the HMC 220 may, in some embodiments, include and/or be operationally associated with one or more address error registers 291 (e.g., a bank of address error registers) and/or one or more corresponding microprocessors (not shown). The address error registers 291 can be used to store read operation addresses of data errors detected in response to a number of read operations requested by the host. The microprocessors can be used to store the read operation addresses for the data errors in the address error registers 291 and/or to retrieve the read operation addresses from the address error registers 291 in response to the host-determined retrieval policies described herein. Address error register 291 is illustrated in association with the controller 240. However, embodiments are not limited to this configuration in that address error registers 291 and/or associated microprocessors, as described herein, may be located elsewhere in the HMC 220 and/or in other types of memory devices. Moreover, in some embodiments, the functionality of the controller 240, the vault controls 288, and/or microprocessors may at least partially included in a number of appropriately configured ASICs.

The controller 240 and/or the vault controls 288 can be coupled to a switch 292 (e.g., a crossbar switch). The switch 292 can provide availability of the collective internal bandwidth from the vaults 284 to the input/output (I/O) links 296. The switch 292 can be coupled to link interfaces (I/F) 294, which control I/O links 296 to the host 210. For example, the I/O links 296 can be serial fully duplexed I/O links. The logic base 282 can provide a logical/physical interface for the HMC memory 220. The HMC memory 220 can receive requests (e.g., for read operations, among other types of operations) from the host 210 and/or a processor thereof.

Various apparatus configurations may be used for performance of reporting a data error in memory, as described herein. At least one embodiment of such an apparatus may include a host (e.g., as shown at 110 and described in connection with FIG. 1 and as shown at 210 and described in connection with FIG. 2) and a logic base 282, where the logic base can include a number of controllers (e.g., controller 240 and/or vault controls 288). The logic base 282 can be coupled to the host via a bus. For example, logic base 282 may be connected to the host via bus 154 shown in and described in connection with FIG. 1 and/or via bus 454 shown in and described in connection with FIG. 4.

The controller may be configured to receive a request packet (e.g., request packet 351 shown in and described in connection with FIG. 3A) that includes an address (e.g., address 361 shown in and described in connection with FIG. 3A) for performance of a requested operation. In some embodiments, the requested operation may be a read operation to be performed at the read operation address in a memory array coupled to the logic base.

The controller may be further configured to direct that a response packet (e.g., response packet 353 shown in and described in connection with FIG. 3B) be sent to the host.

The response packet can include a tag (e.g., a tag 362 encoded in tag field 362-2 as shown in and described in connection with FIG. 3B) that corresponds to a tag used to identify the read request in a corresponding request packet (e.g., the tag 362 encoded in tag field 362-1 as shown in and described in connection with FIG. 3A). The tag can have fewer bits than the read operation address where the data error is detected (e.g., up to nine bits for tag 362-2 shown in FIG. 3B versus up to 34 bits for address 361 shown in FIG. 3A).

The controller 240 in the logic base 282 may, in some embodiments, include a plurality of vault controls 288. Each of the respective plurality of vault controls 288 may be selectably coupled to respective memory arrays 230-1, 230-2, 230-3 . . . , 230-M in a vault 284 of the HMC 220 and each of the respective plurality of vault controls may be selectably coupled to the host. For example, the vault controls 288 can be coupled to switch 292. The switch 292 can be coupled to link I/Fs 294, which may control I/O links 296 to the host 210.

The host may, in various embodiments, be configured to retrieve the read operation address from an address error register 291 associated with the logic base 282 based on execution of a host-determined policy for such retrieval, as described herein, as directed by a controller 240 and/or vault controls 288 of the logic base 282. The host may be further configured to selectively determine whether the data error is to be repaired. Accordingly, the host is further configured to direct the logic base 282 that the data error is either to be repaired or not to be repaired, among other possible options, by initiation and performance of an error repair operation (e.g., by execution of ECC 293, among other suitable error-correcting functionalities). In some embodiments, the ECC 293 may be stored in association with the controller 240 and/or vault controls 288 thereof.

Figure 3A:
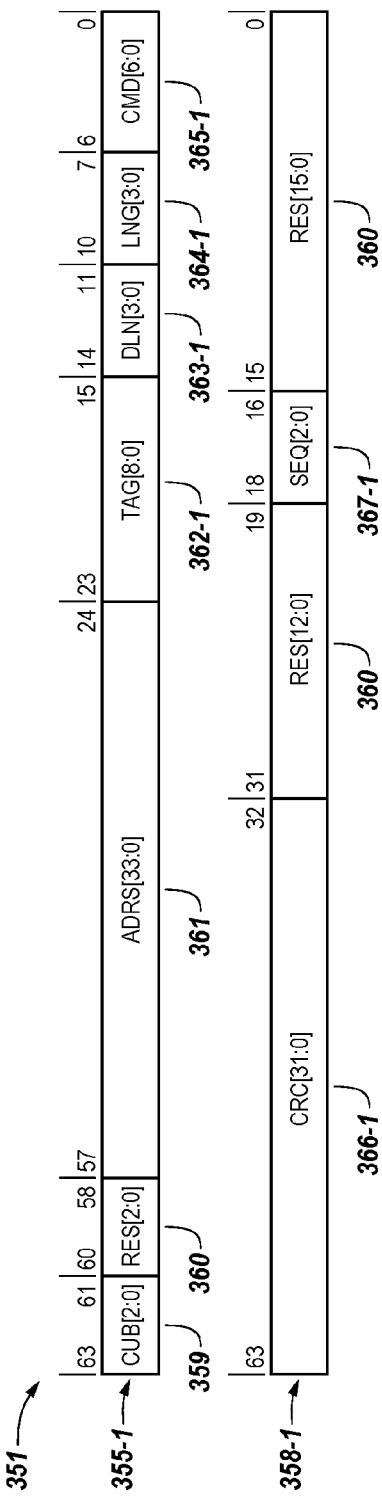
FIG. 3A is a schematic diagram illustrating a request packet in accordance with a number of embodiments of the present disclosure.

FIG. 3A is a schematic diagram illustrating a request packet 351 in accordance with a number of embodiments of the present disclosure. The formatting, size, content, and/or order of instructions in the request packet 351 shown in FIG. 3A and the response packet 353 shown in FIG. 3B are shown by way of illustration and not by way of limitation. For example, embodiments of the number and/or types of coded instructions and/or the sequence in which they are encoded may differ in an actual implementation.

The embodiment of the request packet 351 illustrated in FIG. 3A is shown to include a header field 355-1 and a footer field 358-1. The request packet 351 may include data (e.g., for a requested write operation) between the header field 355-1 and the footer field 358-1. As shown in FIG. 3A, the header field 355-1 and the footer field 358-1 may, for example, each have a length of 64 bits, for a total of 128 bits.

The header field 355-1 can include a command (CMD) 365-1 to specify the type of operation (e.g., a read operation, a write operation, etc.) and, in some embodiments, a size of the operation (e.g., 16, 32, . . . , 128 bytes) the host is requesting the memory device to perform. As described herein, the header field 355-1 also can include other control fields and/or addressing information related to the requested operation. For example, the header field 355-1 can, in embodiments in which the operation is performed by an HMC memory device 220, include a cube identification (CUB) 359 to match a requested operation with a target HMC.

The header field 355-1 can include an address (ADRS) 361 at which the host is requesting the operation to be performed (e.g., a read operation address, as described herein). For example, the address 361 may be a byte address that includes a vault address, a bank address within the vault, and/or a DRAM address that designates particular rows and/or columns, among other addressing options. As shown between the cube identification 359 and the address 361, and at other locations in the header fields 355 and/or footer fields 358 shown in FIGS. 3A and 3B, the header field 355-1 can include a number of reserved (RES) 360 fields that may be bits reserved for additional instructions related, for example, to additional address information, validity check information, operation request information, etc. A memory device may ignore the bits in the reserved 360 fields for performance of the requested operation. In some embodiments, however, the bits in the reserved 360 fields may be included for performance of a cyclic redundancy check (CRC) operation.

A request for an operation is accompanied by a tag (TAG) 362 that is encoded as bits. The tag can be included in both a tag field 362-1 in the request packet 351 shown in FIG. 3A and in a tag field 362-2 in the response packet 353 shown in FIG. 3B. The tag 362 described herein may be a unique request identification number that is allocated to each operation requested by the host to be performed by the memory device. A tag value may remain associated with a requested operation until a report is received by the host indicating that the requested operation has been successfully performed. For example, tags for read requests can be returned in a read response packet with the requested read data or returned with notification of a data error in the data to be read. The tag field 362-1 shown in FIG. 3A and in tag field 362-2 shown in FIG. 3B are shown by way of example to be nine bits long, which is enough space for 512 tags. However, other lengths and/or arrangements for tag fields are consistent with the present disclosure.

Tag assignment and reassignment may be managed by the host (e.g., as shown at 110 and described in connection with FIG. 1 and at corresponding indicator numbers in FIGS. 2 and 4). Tags may be assigned by control logic (e.g., as shown at 460 in FIG. 4) of the host and may, in some embodiments, not be used in another request packet 351 until a response packet 353 with the same tag number is returned to the host indicating the successful completion of the requested operation.

The header field 355-1 of the request packet 351 may, in some embodiments, include a length (LNG) field 364-1 to provide a length in bits of the request packet 351. The length can include the length of the header field 355-1 and the footer field 358-1 (e.g., 128 bits), along with possible associated data. The request packet 351 also may include a length (DLN) field 363-1 to provide a duplicate of the length in bits of the request packet 351. The length and the duplicate of the length may be utilized to verify the length in bits of the request packet 351.

The footer field 358-1 of the request packet 351 may, in some embodiments, include an error-detecting code field 366-1 for detection of possible errors in the header field 355-1 and the footer field 358-1 (e.g., 128 bits), along with the possible associated data. Detection of such errors may, for example, be performed using code for a CRC operation. In some embodiments, the CRC operation may utilize the lengths in the length fields 363-1 and 364-1 in the header field 355-1 for detection of the errors. The footer field 358-1 also may include a sequence number (SEQ) field 367-1. A sequence number may be an incrementing value for each request packet 351 sent from the host (e.g., related to a particular sequence of operations, among other possible sequences).

Figure 3B:
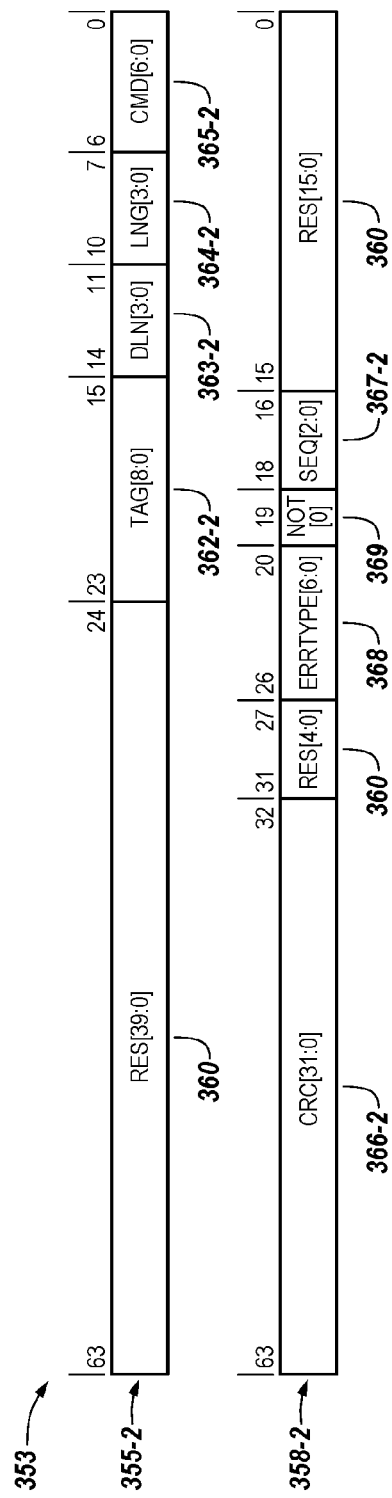
FIG. 3B is a schematic diagram illustrating a response packet in accordance with a number of embodiments of the present disclosure.

FIG. 3B is a schematic diagram illustrating a response packet 353 in accordance with a number of embodiments of the present disclosure. Similar to the request packet 351 shown in FIG. 3A, the embodiment of the response packet 353 illustrated in FIG. 3B is shown to include a header field 355-2 and a footer field 358-2. Following successful completion of a requested read operation, the response packet 353 may include read data between the header field 355-2 and the footer field 358-2. As shown in FIG. 3B, the header field 355-2 and the footer field 358-2 may, for example, each have a length of 64 bits, for a total of 128 bits similar to the request packet 351 shown in FIG. 3A, although embodiments are not limited to this configuration.

As shown in FIG. 3B, the header field 355-2 of the response packet 353 may, in various embodiments, encode some of the same information provided by a corresponding request packet 351. In addition to the same tag 362 in the (TAG) field 362-2 being provided by the corresponding request packet 351, the header field 355-2 of the response packet 353 may include a command (CMD) field 365-2. The command field 365-2 may be a copy of the original command field 365-1 or a different command (e.g., related to a report of the data error and/or read data being provided by the response packet 353). The response packet 353 also may include a length (LNG) field 364-2 to provide a length in bits of the response packet and a duplicate of the length (DLN) field 363-2 that may be utilized to verify a length in bits of the response packet 353, including possible read data.

In contrast to the request packet 351 shown in FIG. 3A including the address (ADRS) 361 at which the host requests the read operation to be performed, the embodiment of the response packet 353 illustrated in FIG. 3B does not include such a read operation address. As shown in FIG. 3A, such addresses may, in some embodiments, be up to 34 bits in length. If such an address were returned in each response packet 353 to report successful completion of, or a data error being detected with regard to performance of, each requested read operation, correlation of each of the requested read operations with the returned read operation addresses may be burdensome to the host. For example, a host (e.g., a host processor) analyzing each of the response packets 353 for read operation addresses and/or data errors related to all requested read operations may reduce the efficiency of a computing system. In addition, the host providing enough memory to correlate tags, addresses, data errors, and/or requested operations may not be a preferred allocation of memory and/or processing resources.

Hence, as described herein, the host 110, 210, 410 is configured to optionally retrieve the read operation addresses for one or more data errors from an address error register (e.g., as shown at 291 in FIG. 2 and at 491 in FIG. 4) responsive to a prompt (e.g., a command) from the host and/or to a host-determined retrieval policy. The retrieval may be directed by a controller associated with the memory device (e.g., controller 140 of memory device 120 shown and described in connection with FIG. 1 and/or controllers and memory devices at corresponding indicator numbers shown in FIGS. 2 and 4).

As shown in FIG. 3B, the footer field 358-2 of the response packet 353 may, in various embodiments, encode some of the same information provided by the footer field 358-1 of a corresponding request packet 351. For example, the footer field 358-2 may include a sequence number (SEQ) field 367-2 for a sequence number that may correspond to the sequence number in the sequence number field 367-1 shown in FIG. 3A. The footer field 358-2 of the response packet 353 also may, in some embodiments, include an error-detecting code field 366-2 for detection of possible errors in the header field 355-2 and the footer field 358-2, along with the possible associated data. Detection of such errors may, for example, be performed using code for a CRC operation.

In addition, the footer field 358-2 of the response packet 353 may, in various embodiments, encode information related to detection of data errors in data intended to be utilized in performance of the read operation corresponding to the tag 362 included in the tag field 362-2 in the header field 355-2. The footer field 358-2 is shown to include an error notification (NOT) field 369 to indicate whether a data error was detected in association with the requested read operation. In some embodiments, the error notification field 369 may be a one-bit field that, for example, may report detection of a data error with a value of 1 in binary and no detection of an error with a value of 0. When a data error has been detected, the footer field 358-2 may report a type of data error in an error type (ERRTYPE) field 368. The type of data error, as described herein, may be reported from a selection of various types, such as a single-bit correctable error (SCE), a multi-bit correctable error (MCE), and/or a multi-bit uncorrectable error (MUE), among other possible types of data error.

The information relating to the requested type of operation (e.g., in command 365-2), notification 369 of detection of the data error, and/or the type of data error 368 may be returned to the host in the response packet 353. The host may utilize and/or present such information to assist in determination of whether and/or when such a data error is to be repaired. To further assist in such a determination, the read operation address for the data error may be retrieved from an address error register 291, 491 associated with the controller of the memory device.

Various apparatus configurations may be used for performance of reporting a data error in memory, as described herein. At least one embodiment of such an apparatus may include a number of memory arrays (e.g., as shown at 230 in FIG. 2 and/or 430 in FIG. 4) and a controller (e.g., as shown at 140 in FIG. 1, at 240 in FIG. 2, and/or 440 in FIG. 4) of the memory arrays. A memory device can include a number of arrays of volatile memory cells. In some embodiments, the arrays may be a stack of DRAM dies (e.g., as described in connection with memory arrays 230-1, 230-2, 230-3 . . . , 230-M in FIG. 2 and arrays 430 in FIG. 4). The apparatus may, in various embodiments, be a PIM capable device, as described herein.

The controller may be configured to receive a request for performance of a read operation at an address in the memory arrays of the memory device. The controller may be further configured to, responsive to the request, direct performance of the requested read operation at the address in the memory array and to direct detection of a data error in data corresponding to the read operation address (e.g., using ECC for the data stored in memory cells of an array, for example) to be included in the performance of the requested read operation. The controller may be further configured to direct storage of the read operation address in an address error register 291 and to direct that a response be sent to a host (e.g., as shown at 110 in FIG. 1 and/or at corresponding reference numbers in FIGS. 2 and 4) and/or to a host processor to report the data error and/or the type of data error, among other information.

The response can enable determination by the host of whether the data error is to be repaired even though the response does not include the read operation address stored in the address error register 291. Moreover, the controller may be configured, responsive to a host-initiated read of the address error register, to direct initiation of the error repair. The host-initiated read of the address error register may be based on host-determined retrieval policies, as described herein, that result in the read operation address being retrieved to the host from the address error register.

The controller can be configured to receive the request (e.g., a request packet 351 as shown in and described in connection with FIG. 3A) from the host on a bus (e.g., as shown at 154 in FIGS. 1 and 454 in FIG. 4). The controller can be further configured to send the response (e.g., a response packet 353 as shown in and described in connection with FIG. 3B) to the host on the bus. In some embodiments, a number of controllers and/or portions of a controller can be formed on a logic base of a HMC (e.g., vault controls 288 in logic base 282 of HMC 220 in FIG. 2).

The logic base 282 coupled to the memory array 230 of the HMC 220 described in connection with FIG. 2 can include a number of address error registers (e.g., as shown at 291 in FIGS. 2 and 491 in FIG. 4). The logic base 282 can be selectably coupled (e.g., via link I/Fs 294, which control I/O links 296, in FIG. 2) to a number of memory arrays (e.g., to memory arrays 230). The logic base 282 may be configured to receive a request packet 351 for performance of a read operation in the memory array. The request packet can include an address 361 for the read operation and a tag 362 to identify an associated read request. The logic base 282 may be further configured to perform an error detection operation (e.g., by directing performance of an ECC operation, for example) on data corresponding to the read operation address and, responsive to detecting an error in the data, to store the read operation address of the detected data error in the address error register 291.

The apparatus may further include a number of microprocessors (e.g., included as part of and/or associated with controller 240 shown in FIG. 2, for example) configured to store read operation addresses of a plurality of data errors, corresponding to a number of read operations, in a corresponding plurality of address error registers (e.g., a bank of address error registers) in the logic base. The same microprocessors or different microprocessors may be configured to retrieve the read operation addresses of the plurality of data errors from the corresponding plurality of address error registers based on a host-determined retrieval policy, as described herein. The microprocessor may be further configured to contribute to the response packet 353 sent to the host and/or to contribute to the read operation address of the detected data error being sent to the host based on the host-determined retrieval policy. As described in connection with FIG. 3B, the response packet 353 can include a notification 369 that the data error is detected and the tag 362 to identify the associated read request Rather than being sent in, or connected to, the response packet 353, a read operation address can be retrieved from an address error register 291 (e.g., in logic base 282) separate from the information in the response packet 353. In various embodiments, one or more read operation addresses may be sent (e.g., in a packet) to the host by responding to a register read request (not shown) from the host and/or by a number of read operation addresses reaching an incremental threshold (e.g., as determined by a counter associated with a microprocessor) based on the host-determined retrieval policy. Read operation address packets (not shown) may be sent to the host via a same channel (e.g., in band) as the response packet 353 and/or via a different channel (e.g., a sideband) than the response packet 353.

The controller 240 and/or vault controls 288 of the logic base 282 may be further configured to enable retrieval of read operation addresses for detected data errors from address error registers based on execution of an appropriate option of a number of options in a host-determined retrieval policy. For example, the host-determined retrieval policy may command the controller 240 that a response packet be individually sent to the host as notification when each data error is detected corresponding to a respective read operation request. Alternatively, a plurality of response packets may be sent to the host as notification (e.g., as a package of response packets) when a plurality of data errors is detected corresponding to a number of read operation requests. For example, the package of response packets may be sent based on an incremental threshold being reached for the plurality of data errors (e.g., as determined by a counter associated with a microprocessor). In some examples, the plurality of data errors and/or types of data errors may be detected as a plurality of SCEs, MCEs, and/or MUEs, among possible other types of data errors, corresponding to a single read operation request.

In some embodiments, the different types of data errors may be stored in dedicated address error registers. For example, one read operation address may be stored per address error register 291 dedicated to that type of data error. In some embodiments, there may be a plurality (e.g., 20-2000) of such dedicated address error registers that form a bank of address error registers dedicated to each of a number of different types of data errors. Address error registers dedicated to different types of data errors may have different host-determined retrieval policies. For example, when each MUE is detected, the host-determined retrieval policy may be that a response packet is sent to the host to enable determination of whether the MUE is to be repaired, whereas when a SCE and/or a MCE is detected, the host-determined retrieval policy may be that a response packet to report each or both is not sent to the host until an incremental threshold has been reached for a plurality of these data error types.

Hence, as described herein, each read operation address may be stored in an address error register 291 of the logic base 282 and may be selectively retrievable from the address error register to the host based on the type of data error. In some embodiments, the controller 240 and/or vault controls 288 may be configured to direct that a first address error register entry be stored in the address error register 291 until initiation of the error repair by the host 210. For example, when a command is received from the host to repair a data error, an error repair operation is initiated by the controller 240 and/or vault controls 288 (e.g., using the ECC 293) and the corresponding read operation address may be dropped (e.g., erased) from the address error register 291. Similarly, when a command is received from the host not to repair a data error, the corresponding read operation address also may be erased from the address error register 291.

As such, the logic base 282 is configured to selectively determine whether an error repair operation is initiated. For example, memory device 220 can be configured to store read operation addresses of a plurality of detected data errors, corresponding to performance of a number of read operations, in a corresponding plurality of address error registers of the logic base and retrieve the read operation addresses of the plurality of detected data errors from the corresponding plurality of address error registers to enable selective determination of whether an error repair operation is initiated for each detected data error. The logic base 282 can be further configured to contribute (e.g., using a microprocessor) to a response packet 353 sent to the host, where the response packet includes a notification 369 that the data error is detected, and contribute (e.g., using a microprocessor) to the read operation address of the detected data error being sent to the host responsive to the host-determined retrieval policy.

Embodiments described herein provide a method of operating an apparatus that may be in the form of a computing system 100, 270, and/or 400 including a host 110, 210, and/or 410 and a memory device 120, 220, and/or 420, as shown in and described in connection with FIGS. 1, 2, and 4, respectively, for selective determination or data error repair. As described herein, the method can include, responsive to a read request (e.g., request packet 351) from a host, performing a read operation on the memory device and, responsive to detecting an error in data corresponding to the read operation, storing an address (e.g., read operation address 361) corresponding to the read operation in an address error register (e.g., address error register 291) of the memory device. The method can further include sending a response (e.g., response packet 353) to the read request to the host, where the response reports the data error (e.g., 369) detected in the data corresponding to the read operation but does not include the read operation address (e.g., 361).

As described herein, the read operation address (e.g., 361) stored in the address error register (e.g., 291) of the memory device may be sent to the host responsive to a host-determined retrieval policy. In combination with and/or based upon receipt of the read operation address of the data error, options for repair of the data error may be made available to the host for selection. In some embodiments, the host (e.g., the host processor) may select an option for error repair based upon a stored repair protocol that uses various factors related to the requested read operation, the data error itself (e.g., the type of data error, which is reported in the ERRTYPE field 368 of the response packet 353), and/or the address of the data error, among other possible factors, to make a determination of the option to select.

In some embodiments, the options for error repair may be presented to a user (e.g., a technician, operation manager, etc.) in a readable format (e.g., on a display screen of a user interface). Presenting the options for error repair may enable the user to select (e.g., via a touch screen, keyboard input, etc.) from the error repair options. Such options may include to initiate error repair at that time, not to repair the data error at all, and/or to initiate error repair later, etc. The options for error repair presented to the stored repair protocol and/or the user may include presenting the detected data error as a type of data error selected from a SCE, a MCE, and/or a MUE, among possible other types of data errors, which may be included in the factors related to the data error itself that influence selection from the error repair options.

When a plurality of data errors are detected, additional address error registers (e.g., 291) may be utilized (e.g., in a bank of address error registers) for storage of the read operation addresses of the data errors. To reduce likelihood of filling available address error register space with read error addresses (e.g., where there is one error address per address error register), a circular buffer structure can be implemented. For example, with a particular number of such address error registers (e.g., 100 address error registers), the oldest error address entries may be dropped (e.g., erased) to make space available for newer error address entries in the address error registers.

The options for error repair made available to the stored repair protocol and/or presented to the user may include enabling initiation of an error repair operation at a time at which performance of other data processing operations (e.g., read operations, write operations, logical operation such as Boolean operation, etc.) is reduced. The options also can include enabling a bypass of an otherwise automated error repair operation, for example, a built-in self-test (BIST) operation and/or an ECC operation otherwise initiated based on detection of a data error.

Figure 4:
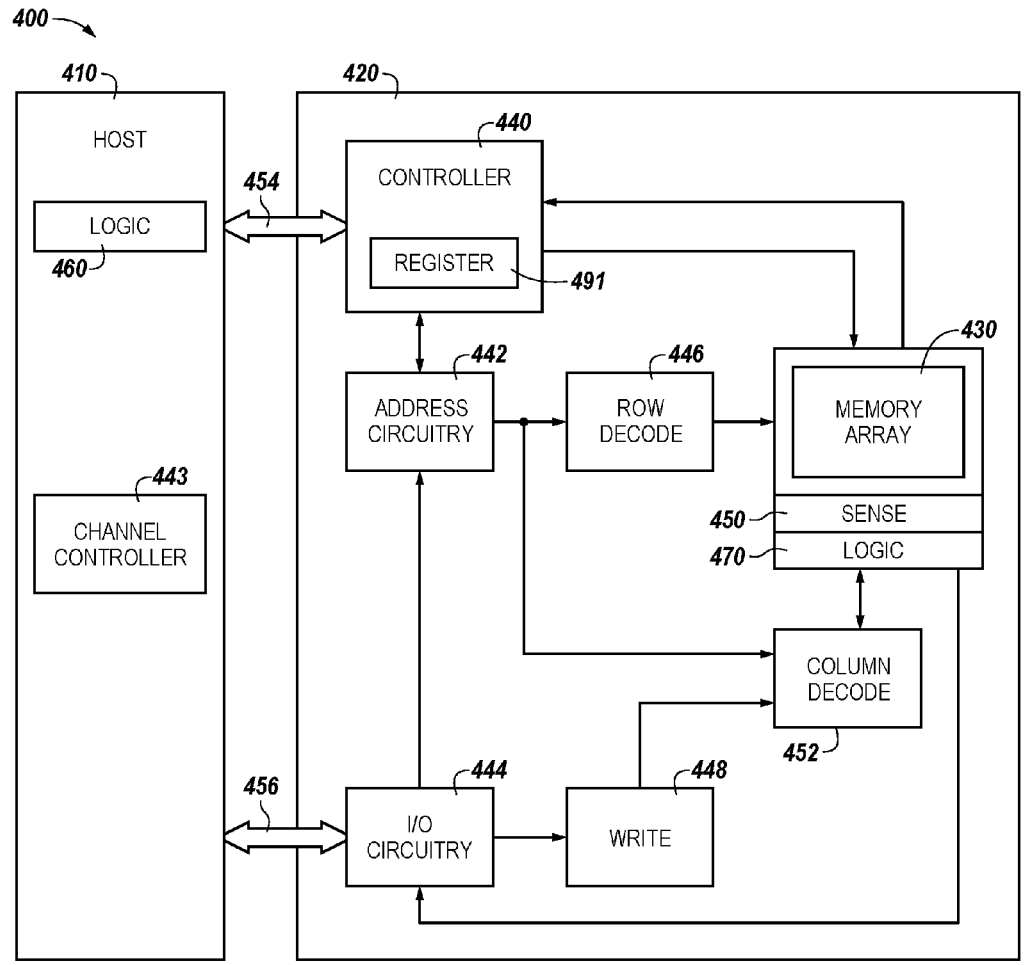
FIG. 4 is another block diagram of an apparatus in the form of a computing system including a host and a memory device in accordance with a number of embodiments of the present disclosure.

FIG. 4 is another block diagram of an apparatus in the form of a computing system 400 including a host 410 and a memory device 420 in accordance with a number of embodiments of the present disclosure. As used herein, a memory device 420, controller 440, channel controller 443, memory array 430 of the memory device, sensing circuitry 450, and logic circuitry 470 each might also be separately considered an "apparatus."

Computing system 400 can include the host 410 being coupled (e.g., connected) to memory device 420, which includes the memory array 430. In a number of embodiments, memory device 420 can be a PIM device. PIM capable device operations can use bit vector based operations. As used herein, the term "bit vector" is intended to mean a number of bits on a bit vector memory device (e.g., a PIM device) stored in a row of an array of memory cells and/or in sensing circuitry. Thus, as used herein a "bit vector operation" is intended to mean an operation that is performed on a bit vector that is a portion of virtual address space and/or physical address space (e.g., used by a PIM device). In some embodiments, the bit vector may be a physically contiguous number of bits on the bit vector memory device stored physically contiguous in a row and/or in the sensing circuitry such that the bit vector operation is performed on a bit vector that is a contiguous portion of the virtual address space and/or physical address space.

For example, a row of virtual address space in the PIM device may have a bit length of 16K bits (e.g., corresponding to 16K complementary pairs of memory cells in a DRAM configuration). Sensing circuitry 450, as described herein, for such a 16K bit row may include a corresponding 16K processing elements (e.g., compute components, as described herein) formed on pitch with the sense lines selectably coupled to corresponding memory cells in the 16 bit row. A compute component in the PIM device may operate as a one-bit processing element on a single bit of the bit vector of the row of memory cells sensed by the sensing circuitry 450 (e.g., sensed by and/or stored in a sense amplifier paired with the compute component, as described herein).

The computing system 400 can be, for instance, a server system and/or a high performance computing (HPC) system and/or a portion thereof. Although the example shown in FIG. 4 may be a computing system having a Von Neumann architecture, embodiments of the present disclosure can be implemented in non-Von Neumann architectures, which may not include one or more components (e.g., CPU, ALU, etc.) often associated with a Von Neumann architecture.

For clarity, description of the computing system 400 has been simplified to focus on features with particular relevance to the present disclosure. The memory array 430 can be a DRAM array, PIM array, SRAM array, STT RAM array, PCRAM array, TRAM array, RRAM array, NAND flash array, and/or NOR flash array, for instance, any of which may be used independently or in combination (e.g., in HMC 220). The array 430 can include memory cells arranged, for example, in rows coupled by access lines (which may be referred to as word lines or select lines) and columns coupled by sense lines (which may be referred to as data lines or digit lines). Although a single array 430 is shown in FIG. 4, embodiments are not so limited. For instance, memory device 420 may include a number of arrays 430 (e.g., a number of banks of DRAM cells, NAND flash cells, etc.).

The memory device 420 is shown to include, for example, address circuitry 442 to latch address signals provided over a data bus 456 (e.g., an I/O bus) through I/O circuitry 444. Status and/or exception information can be provided from the controller 440 on the memory device 420 to a channel controller 443, for example, through a high speed interface (HSI) including an out-of-band bus 454, which in turn can be provided from the channel controller 443 to the host 410. The bus 454 can be used by the host 410 to dispatch commands (e.g., commands of operations described herein) to a plurality of memory devices 420-1, . . . , 420-N (not shown) to store those program instructions within a given bank of a memory device. Address signals may be received through address circuitry 442 and decoded by a row decoder 446 and a column decoder 452 to access the memory array 430. Data can be read from memory array 430 by sensing voltage and/or current changes on the data lines using sensing circuitry 450. The sensing circuitry 450 can read and latch a page (e.g., row) of data from the memory array 430. The I/O circuitry 444 can be used for bidirectional data communication with host 410 over the data bus 456. The write circuitry 448 is used to write data to the memory array 430.

Controller 440 (e.g., bank control logic and/or sequencer) may decode signals provided by control bus 454 from the host 410. These signals can include chip enable signals, read enable signals, write enable signals, and address latch signals, among others, that are used to control operations performed on the memory array 430, including data read, data write, and/or data erase operations. In various embodiments, the controller 440 is responsible for executing instructions from the host 410 and sequencing access to the array 430. The controller 440 can be a state machine, a sequencer, or some other type of controller. The controller 440 can control shifting data (e.g., right or left) in an array (e.g., memory array 430).

The controller 440 may be responsible for directing performance of error detection operations in response to a command from the host to perform a read operation and/or for directing performance of error correction operations in response to a command from the host based upon retrieval of read operation addresses responsive to the host-determined retrieval policy. For example, the controller 440 may direct one functionality to perform error detection (e.g., CRC, among other possible error detection functionalities) in request and/or response packets, for example, and another functionality to perform error correction (e.g., ECC, among other possible error correction functionalities) for data stored in memory cells of an array, for example. In some embodiments, the same functionality may be utilized to perform both error detection and correction (e.g., ECC for the data stored in the memory cells of the array, for example).

In a number of embodiments, the sensing circuitry 450 can include a number of sense amplifiers and a number of compute components. A compute component may serve as an accumulator that may be used to perform logical operations (e.g., on data associated with complementary data lines). In a number of embodiments, the sensing circuitry 450 can be used to perform logical operations using data stored in array 430 as inputs and to store the results of the logical operations back to the array 430 without transferring data via a sense line address access (e.g., without firing a column decode signal). As such, various compute functions can be performed using, and within, sensing circuitry 450 rather than (or in association with) being performed by processing resources external to the sensing circuitry (e.g., by a processor associated with host 410 and/or other processing circuitry, such as ALU circuitry, located on device 420 (e.g., on controller 440 or elsewhere).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of address error registers and would perform compute functions using the operands, and the result would be transferred back to the array via the I/O lines.

In contrast, sensing circuitry 450, as described herein, is configured to perform logical operations on data stored in memory array 430 and store the result back to the memory array 430 without enabling an I/O line (e.g., a local I/O line) coupled to the sensing circuitry 450. The sensing circuitry 450 can be formed on pitch with the memory cells of the array. Additional logic circuitry 470 can be coupled to the sensing circuitry 450 and can be used to store (e.g., cache and/or buffer) results of operations described herein. In some embodiments, logic circuitry 470 may represent memory control logic for each vault 284 that can consolidate functions of the vaults of an HMC 220.

Logic, as described herein, is intended to mean hardware, for example, in the form of an ASIC, a field programmable gate array (FPGA), and/or firmware to implement one or more particular functions. One example of logic may include a state machine. Another example may include an embedded processing resource. Logic can include instructions (e.g., PIM commands and/or microcode instructions) that can be sent to a memory device having processing capabilities to implement logical operations. As such, the logic may be associated with (e.g., located at and/or connected to) the host 410, the controller 440, and/or the memory array 430 (e.g., at logic 470).

Accordingly, in a number of embodiments, circuitry external to memory array 430 and sensing circuitry 450 is not needed to perform compute functions because the sensing circuitry 450 can perform the appropriate logical operations to perform such compute functions without the use of an external processing resource. Therefore, the sensing circuitry 450 may be used to compliment and/or to replace, at least to some extent, such an external processing resource (or at least the bandwidth consumption of such an external processing resource).

However, in a number of embodiments, the sensing circuitry 450 may be used to perform logical operations (e.g., to execute instructions) in addition to logical operations performed by an external processing resource (e.g., host 410). For instance, host 410 and/or sensing circuitry 450 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 450) can be used to perform logical operations without enabling column decode lines of the array; however, the local I/O line(s) may be enabled in order to transfer a result to a suitable location other than back to the array 430 (e.g., to an external register).

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory array; and
   a controller coupled to the memory array and configured to:
      direct performance, responsive to a request, of a read operation at an address in the memory array;
      direct detection of an error in data corresponding to the read operation address;
      direct storage of the read operation address in an address error register; and
      direct a response to the request be sent to enable selective determination of error repair, wherein the response does not include the read operation address.

2. The apparatus of claim 1, wherein the controller is further configured, responsive to a host-initiated read of the address error register, to direct initiation of the data error repair.

3. The apparatus of claim 1, wherein the controller is further configured to direct that a first address error register entry be stored in the address error register until initiation of the data error repair.

4. The apparatus of claim 1, wherein the request is included in a request packet and the response is included in a response packet that each include a tag to correlate the request packet and the response packet.

5. The apparatus of claim 1, wherein the controller is further configured to receive the request from a host.

6. The apparatus of claim 1, wherein the controller is further configured to send the response to a host.

7. The apparatus of claim 1, wherein the controller is located on a logic base of a hybrid memory cube (HMC).

8. The apparatus of claim 1, wherein the apparatus comprises a stack of dynamic random access memory (DRAM) dies.

9. An apparatus, comprising:
   a memory array; and
   a logic base coupled to the memory array and comprising an address error register; and
   wherein the logic base is configured to:
      receive a request packet for performance of a read operation in the memory array, wherein the request packet comprises an address for the read operation;
      perform an error detection operation on data corresponding to the read operation address;
      responsive to detecting an error in the data, store the read operation address in the address error register; and
      enable retrieval of the read operation address from the address error register to selectively determine from a plurality of error repair options whether an error repair operation is initiated.

10. The apparatus of claim 9, wherein apparatus is configured to:
    store read operation addresses of a plurality of detected data errors, corresponding to performance of a number of read operations, in a corresponding plurality of address error registers of the logic base; and
    retrieve the read operation addresses of the plurality of detected data errors from the corresponding plurality of address error registers to enable selective determination of whether an error repair operation is initiated for each detected data error.

11. The apparatus of claim 9, wherein the logic base is further configured to:
    contribute to a response packet sent to a host, wherein the response packet comprises a notification that the data error is detected; and
    contribute to the read operation address of the detected data error being sent to the host responsive to a host-determined retrieval policy.

12. The apparatus of claim 11, wherein the host-determined retrieval policy is that the response packet is sent to the host as notification when each data error is detected in the data.

13. The apparatus of claim 11, wherein the host-determined retrieval policy is that a plurality of response packets is sent to the host as notification when a plurality of data errors detected in the data reaches a threshold.

14. An apparatus, comprising:
    a host;
    a logic base, wherein the logic base comprises a controller and is coupled to the host via a bus; and
    wherein the controller is configured to:
       receive a request packet that comprises an address for performance of a read operation;
       direct that a response packet to the request packet be sent to the host, wherein the response packet comprises an indication of a type of data error for an error detected in data corresponding to the read operation address and does not include the read operation address; and
    wherein the host is configured to:
       retrieve the read operation address from the logic base; and
       selectively determine from a plurality of error repair options whether the data error is to be repaired.

15. The apparatus of claim 14, wherein each read operation address:
    is stored in an address error register of the logic base; and
    is retrievable from the address error register to the host based on the type of data error.

16. The apparatus of claim 14, wherein the host is further configured to command the logic base that the data error be repaired.

17. The apparatus of claim 14, wherein the host is further configured to command the logic base that the data error not be repaired.

18. The apparatus of claim 14, wherein:
the controller is one of a plurality of vault controls in the logic base;
the respective plurality of vault controls is selectably coupled to respective memory arrays in a vault of a hybrid memory cube (HMC); and
the respective plurality of vault controls is selectably coupled to the host.

19. A method, comprising:
responsive to a read request from a host, performing a read operation on a memory device;
responsive to detecting an error in data corresponding to the read operation, storing an address corresponding to the read operation in an address error register of the memory device; and
sending a response to the read request to the host, wherein the response reports the data error detected in the data corresponding to the read operation and does not include the address corresponding to the read operation.

20. The method of claim 19, wherein the method further comprises sending the address stored in the address error register to the host responsive to a host-determined retrieval policy.

21. The method of claim 19, wherein the method further comprises the host selecting an option for error repair based upon a stored repair protocol.

22. The method of claim 19, wherein the method further comprises presenting options for error repair to a user in a readable format.

23. The method of claim 22, wherein presenting the options for error repair comprises enabling the user to select from the repair options.

24. The method of claim 19, wherein the method further comprises enabling initiation of an error repair operation by the host at a time at which performance of other data processing operations is reduced.

25. The method of claim 19, wherein the method further comprises enabling a bypass of an automated error repair operation.

26. The method of claim 19, wherein the method further comprises the response reporting a detected data error as a type of data error selected from a single-bit correctable error, a multi-bit correctable error, and a multi-bit uncorrectable error.

* * * * *